(12) United States Patent
Ogino et al.

(10) Patent No.: US 7,208,869 B2
(45) Date of Patent: Apr. 24, 2007

(54) LIGHT EMITTING DEVICE AND METHOD OF MANUFACTURING THE SAME

(75) Inventors: Kiyofumi Ogino, Atsugi (JP); Noriko Shibata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/940,011

(22) Filed: Sep. 14, 2004

(65) Prior Publication Data

US 2005/0029935 A1 Feb. 10, 2005

Related U.S. Application Data

(62) Division of application No. 10/177,752, filed on Jun. 24, 2002, now Pat. No. 6,887,392.

(30) Foreign Application Priority Data

Jun. 25, 2001 (JP) .............................. 2001-191678

(51) Int. Cl.
*H05B 33/00* (2006.01)
*H05B 33/14* (2006.01)

(52) U.S. Cl. .................. 313/504; 313/503; 313/506; 428/690

(58) Field of Classification Search ................. 313/506, 313/504, 503; 428/690, 917; 257/88, 89
See application file for complete search history.

(56) References Cited

U.S. PATENT DOCUMENTS 6,500,604 B1 12/2002 Dimitrakopoulos et al.
6,506,616 B1 1/2003 Kim et al.
6,559,594 B2 5/2003 Fukunaga et al.
6,566,156 B1 5/2003 Sturm et al.
6,566,806 B1 * 5/2003 Kawai ........................ 313/504
6,593,691 B2 7/2003 Nishi et al.
6,608,449 B2 8/2003 Fukunaga
6,620,528 B1 9/2003 Yamazaki et al.
6,768,260 B2 7/2004 Fukunaga et al.
6,776,880 B1 8/2004 Yamazaki
6,781,162 B2 8/2004 Yamazaki et al.
6,830,494 B1 12/2004 Yamazaki et al.
2003/0042849 A1 * 3/2003 Ogino ........................ 313/504

FOREIGN PATENT DOCUMENTS

EP 0 892 028 1/1999
JP 11-054270 2/1999

* cited by examiner

*Primary Examiner*—Rena Dye
*Assistant Examiner*—Camie S. Thompson
(74) *Attorney, Agent, or Firm*—Eric J. Robinson; Robinson Intellectual Property Law Offic, P.C.

(57) ABSTRACT

An easier method is provided to manufacture a light emitting device that can display a full-color image using a polymeric organic compound. In the present invention, some of polymeric organic compounds are dissolved in a protic solvent while the others are dissolved in an aprotic solvent and the obtained solutions are applied to form organic compound films having laminate structures. A conductive film to serve as an etching stopper is formed on the organic compound films, so that portions of the organic compound films that do not overlap the conductive film are etched away. By using wet etching and dry etching in combination, different organic compound films each composed of a plurality of polymeric organic compounds can be formed in different light emitting elements on the same substrate.

24 Claims, 11 Drawing Sheets

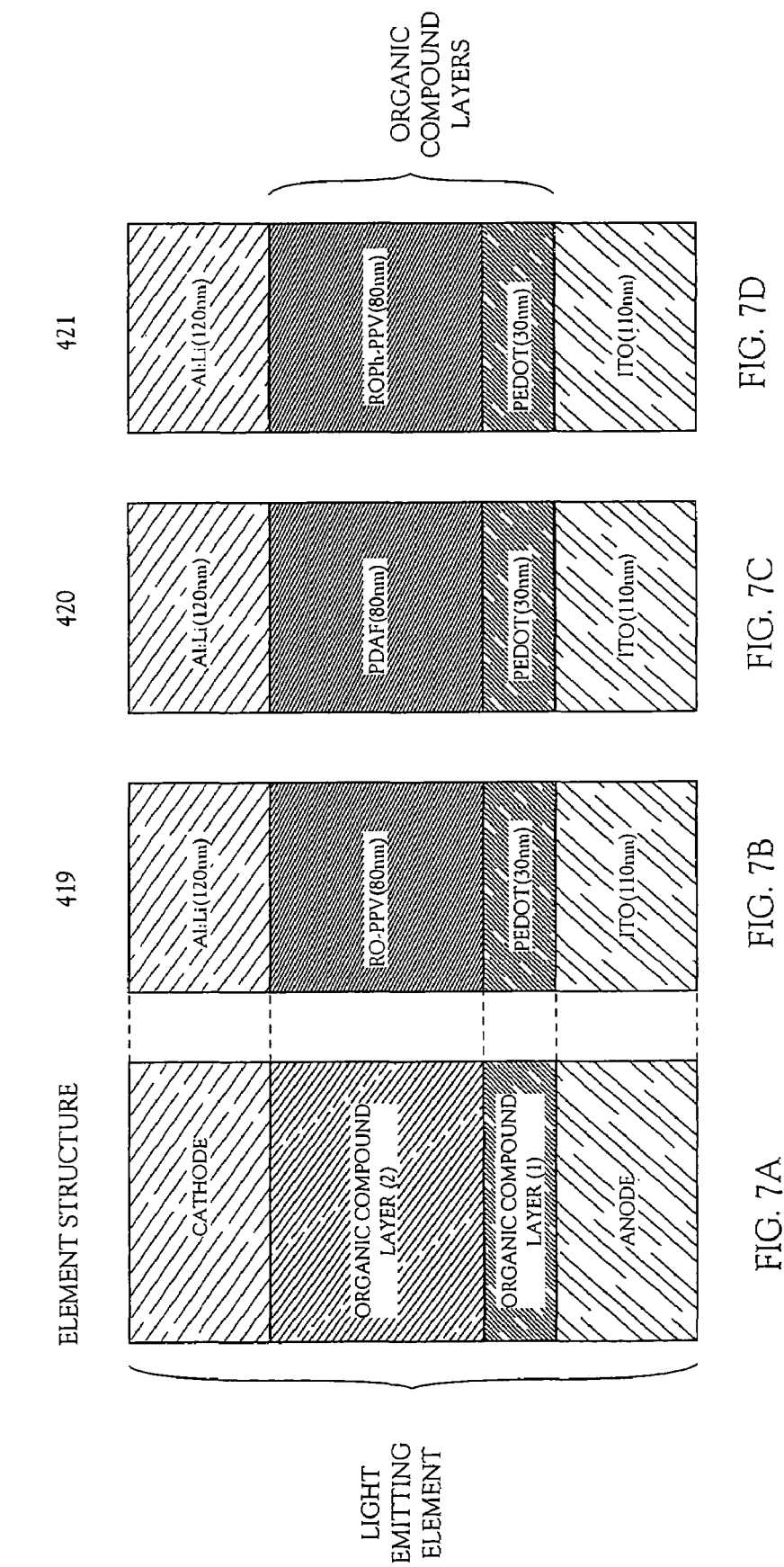

LIGHT EMITTING DEVICE AND METHOD OF MANUFACTURING THE SAME

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a film containing an organic compound (the film is hereinafter referred to as organic compound layer), and to a method of manufacturing the light emitting device. In the present invention, the term light emitting device includes to an image display device that uses a light emitting element. Also, the following modules are all include in the definition of the light emitting device: a module obtained by attaching to a light emitting element a connector such as an FPC (flexible printed circuit), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) method.

2. Description of the Related Art

Light emitting elements, which employ organic compounds as light emitting member and are characterized by their thinness and light weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich an organic compound layer, electrons injected from the cathode and holes injected from the anode are re-combined at the luminescent center of the organic compound layer to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is large, active matrix light emitting devices in which each pixel (of each dot) has a switch are considered as advantageous because they can be driven with low voltage.

Organic compounds for forming an organic compound layer (strictly speaking, light emitting layer), which is the center of a light emitting element, ate classified into low molecular weight materials and polymeric (polymer) materials. Both types of materials are being studied but polymeric materials are the ones that are attracting attention because they are easier to handle and have higher heat resistance than low molecular weight materials.

Known methods for forming these organic compounds into films are, for example, ink jet, evaporation, and spin coating. The ink jet method is particularly well known as a method that allows a light emitting device to display a full-color image using a polymeric material.

However, special devices such as a high-accuracy stage, an automatic alignment mechanism, and an ink head are necessary when a full-color flat panel display that emits red light, green light, and blue light is to be manufactured by the ink jet method.

In addition, the ink jet method has the problem of 'off-course flight'; the ink jet method sends a jet of polymeric material into the air and, if the distance between the application target surface and the nozzle of the ink jet head is not set appropriately, the shot misses the target.

Furthermore, the ink jet method ejects ink containing an organic compound from a nozzle and a problem of a clogged nozzle when the ink has high viscosity occurs. If the viscosity of the ink is lowered to counter this problem, the concentration of the organic compound contained in the ink is lowered as well and the film formed from this ink has a smaller thickness than the film that is formed under the same condition from the ink that is not thinned. Accordingly, the function thereof cannot be fully exerted or the number of times the thinned ink has to be ejected increases.

Alternatively, the problem of clogged nozzle can be solved by increasing the diameter of the nozzle. However, it is impossible to perform high-precision patterning with a nozzle having large diameter.

These problems of off-course flight and clogged nozzle are detailed in JP 11-54270 A mentioned above.

Moreover, when a film is formed by patterning using the ink jet method, it is necessary to form a tall bank on the surface for forming the film and to conduct surface treatment in order to raise the accuracy of the film formation. Specifically, the substrate is exposed to plasma so that only the bank surface is ink-proof and the ink adheres to a desired position.

As described above, the ink jet method requires the use of the special ink jet devices, optimization of ink, and treatment of the surface to which the ink is to be applied. Therefore, the ink jet method is not the optimum film formation method, nor an easy method.

SUMMARY OF THE INVENTION

The present invention has been made in view of the above, and an object of the present invention is therefore to provide a simpler method for applying a plurality of polymeric materials to different areas compared to the case of using the ink jet method to form polymeric materials into films, and to provide a light emitting device manufactured by this method.

In the present invention, some of polymeric organic compounds are in a protic solvent while the others are dissolved in an aprotic solvent and the obtained solutions are applied to form laminate structures having a plurality of organic compound films. A conductive film to serve as an etching stopper is formed on the organic compound films, so that portions of the organic compound films that do not overlap the conductive film are etched away. Organic compound films formed from polymeric organic compounds that are soluble in an aprotic solvent can be etched by wet etching or dry etching. Organic compound films formed from polymeric organic compounds that are soluble in a protic solvent can be etched by dry etching. By using wet etching and dry etching in combination, different organic compound films each composed of a plurality of polymeric organic compounds can be formed in different light emitting elements on the same substrate.

An aspect of the present invention disclosed in this specification is a method of manufacturing a light emitting device, characterized by comprising:

applying a solution obtained by dissolving a first polymeric organic compound in a protic solvent to an application target surface by spin coating to form a first organic compound film;

applying a solution obtained by dissolving a second polymeric organic compound in an aprotic solvent to the top face of the first organic compound film by spin coating to form a second organic compound film;

forming a first conductive film by patterning on the second organic compound film;

removing regions of the second organic compound film that do not overlap the first conductive film by wet etching;

applying a solution obtained by dissolving a third polymeric organic compound in an aprotic solvent to the top faces of the first organic compound film and of the first conductive film by spin coating to form a third organic compound film;

forming a second conductive film by patterning on the third organic compound film;

removing, by dry etching, regions of the third organic compound film that do not overlap the second conductive film and regions of the first organic compound film that do not overlap the first and the second conductive films; and forming the first organic compound film and the second organic compound film, or the first organic compound film and the third organic compound film, at a position overlapping the first conductive film or the second conductive film.

Another aspect of the present invention is a method of manufacturing a light emitting device, characterized by comprising:

forming a plurality of anodes on an insulating surface;

forming an insulating layer for covering the edges of the anodes;

applying a solution obtained by dissolving a first polymeric organic compound in a protic solvent to the top faces of the anodes and of the insulating layer by spin coating to form a first organic compound film;

applying a solution obtained by dissolving a second polymeric organic compound in an aprotic solvent to the top face of the first organic compound film by spin coating to form a second organic compound film;

forming a first cathode at a position on the second organic compound film where the second organic compound film overlaps the first anode to form a first light emitting element;

removing regions of the second organic compound film that do not overlap the first cathode by wet etching;

applying a solution obtained by dissolving a third polymeric organic compound in an aprotic solvent to the top faces of the first organic compound film and of the first cathode by spin coating to form a third organic compound film;

forming a second cathode at a position on the third organic compound film where the third organic compound film overlaps the second anode to form a second light emitting element;

removing regions of the third organic compound film that do not overlap the second cathode by wet etching;

applying a solution obtained by dissolving a fourth polymeric organic compound in an aprotic solvent to the top faces of the first organic compound film and of the first and the second cathodes by spin coating to form a fourth organic compound film;

forming a third cathode at a position on the fourth organic compound film where the fourth organic compound film overlaps the third anode to form a third light emitting element;

removing, by dry etching, regions of the fourth organic compound film that do not overlap the third cathode and regions of the first organic compound film that do not overlap the first, the second, and the third cathodes; and a water-based organic compound film and a solvent-based organic compound film are formed at positions overlapping the first, the second, and the third cathodes.

In the above aspects, the methods are characterized in that the solutions obtained by dissolving polymeric organic compounds in the protic solvent or in the aprotic solvent are applied by spin coating. Spin coating is capable of improving the uniformity of the films formed compared to the ink jet method that is known as a method of forming a polymeric material into a film.

In the above aspects, the methods are characterized in that the organic compound films are etched by wet etching and dry etching.

In the above aspect, the methods are characterized in that wet etching is for removing the organic compound film exposed on the substrate surface by ejecting an aprotic solvent and dry etching is for removing the organic compound film by irradiation of $O_2$ plasma. Wet etching can employ as an etchant an aprotic solvent, which is not necessarily identical with the aprotic solvent that is used to dissolve the polymeric organic compound.

In the above aspect, only the film formed of the polymeric organic compound that is soluble in the aprotic solvent is etched by wet etching. When dry etching is used, the film formed of the polymeric organic compound that is soluble in the aprotic solvent and the film formed of the polymeric organic compound that is soluble in the protic solvent can be etched. In short, when the laminate of the polymeric organic compound films having different solubility with respect to a solvent are etched by the wet etching, only the film formed of the polymeric organic compound that is soluble in the aprotic solvent is etched and therefore the film formed of the polymeric organic compound that is soluble in the protic solvent can be left exposed on the surface. By employing dry etching, it is possible to etch both the film soluble in the aprotic solvent and the film soluble in the protic solvent.

In the case where a film is formed from a polymeric organic compound that is soluble in a protic solvent and then a film is formed from a polymeric organic compound that is soluble in an aprotic solvent on the former film using different materials, wet etching is employed so that only the film formed of the polymeric organic compound that is soluble in the aprotic solvent is etched. On the other hand, in the case where these organic compound films are to be individually formed in one element and then in another element, dry etching can be employed.

Since the conductive film (cathode) formed on the organic compound film functions as an etching stopper during etching, regions of the organic compound film where the organic compound film overlaps the conductive film (cathode) are not etched by wet etching or by wet etching.

In the above aspect, a polymeric organic compound which is soluble in a protic solvent and which is capable of injecting holes refers mainly to a polymeric organic compound soluble in water. Specifically, the water-soluble polymeric organic compound is PEDOT (poly (3,4-ethylene dioxythiophene)), polyaniline (PANI), or other conjugate polymer materials.

In the above aspect, the method is characterized in that the polymeric organic compound for forming an organic compound layer which is soluble in the aprotic solvent is one or more kinds of organic solvent-soluble substances selected from the group consisting of a polyparaphenylene vinylene derivative, a polythiophene derivative, a polyfluolene derivative, a polyparaphenylene derivative, a polyalkylphenylene, a polyacetylene derivative, and the like.

As the polyparaphenylene vinylene derivative, poly(2,5-dialkoxy-1,4-phenyl enevinylene): RO-PPV or poly (2-dialkoxyphenyl-1,4-phenylenevinylene): ROPh-PPV can be used. Specifically, materials such as poly (2-methoxy-5-(2-ethyl-hexoxy)-1,4-phenylenevinylene): MEH-PPV and poly (2,5-dimethyloctylsilyl-1,4-phenylenevinylene): DMOS-PPV can be used.

As the polyparaphenylene derivative, poly(2,5-dialkoxy-1,4-phenylene): RO-PPP can be used. Specifically, materials such as perfluoropylated-PPT: FP-PPP, or the like can be used.

As the polythiophene derivative, poly(3-alkylthiophene): PAT can be used. Specifically, materials such as poly(3-hexylthiophene): PHT, poly(3-cyclohexylthiophene): PCHT can be used. In addition, poly (3-cyclohexyl-4-methylthiophene): PCHMT, poly (3-[4-octylphenyl]-2,2'-bithiophene): PTOPT, poly(3-(4-octylphenyl)-thiophene): POPT-1 or the like can be used.

As the polyfluorene derivative, poly(dialkylfluorene): PDAF can be used. Specifically, materials such as poly (dioctylfluorene): PODF can be used.

As the polyacetylene derivative, materials such as polypropylphenylacetylene: PPA-iPr, poly[1-(p-n-butylphenyl)-2-phenylacetylene: PDPA-nBu, and polyhexylphenylacetylene: PHPA can be used.

Further, in the above aspect, the polymeric organic compound which is soluble in an aprotic solvent also include those whose precursor is soluble in an aprotic solvent, and which can be polymerized by heat treatment after the forming of a film using the spin coating method Further, in the above aspect, the method is characterized in that aprotic solvent are one or more solvent selected from toluene, benzene, chlorobenzene, dichlorobenzene, chloroform, tetralin, xylene, anisole, dichloromethane, γγ-butyrolactone, butylcellosolve, cyclohexane, NMP (N-methyl-2-pyrrolidone), dimethyl sulfoxide, cyclohexanone, dioxane and THF (tetrahydrofuran).

In the above aspects, the methods are characterized in that the organic compound films are formed under an inert gas atmosphere such as nitrogen and argon. The oxygen concentration is set to 500 ppm or less.

A light emitting device obtained by carrying out the method of the present invention is comprised of: a first light emitting element composed of a first organic compound layer that is in contact with a first anode, a second organic compound layer that is in contact with the first organic compound layer, and a first cathode that is in contact with the second organic compound layer; a second light emitting element composed of a third organic compound layer that is in contact with a second anode, a fourth organic compound layer that is in contact with the third organic compound layer, and a second cathode that is in contact with the fourth organic compound layer; a third light emitting element composed of a fifth organic compound layer that is in contact with a third anode, a sixth organic compound layer that is in contact with the fifth organic compound layer, and a third cathode that is in contact with the sixth organic compound layer; and a conductive film that is in contact with the first, the second, and the third cathode and the device is characterized in that: the first organic compound layer and the second organic compound layer of the first light emitting element overlap the first cathode; the third organic compound layer and the fourth organic compound layer of the second light emitting element overlap the second cathode; the fifth organic compound layer and the sixth organic compound layer of the third light emitting element overlap the third cathode; and the conductive film is in contact with the first through the sixth organic compound layers.

The first organic compound layer, the second organic compound layer, and the third organic compound layer of the light emitting elements are formed from the same material at the same time. If dry etching is used, the organic compound layers are formed independently.

The case described here uses four kinds of polymeric organic compounds to form three kinds of light emitting elements, but the present invention is not limited thereto. Two kinds of light emitting elements may be formed from three kinds of polymeric organic compounds, or five or more kinds of polymeric organic compounds may be used to form four or more kinds of light emitting elements. In the above aspects, an organic compound layer formed from polymeric organic compounds can partially contain an inorganic compound.

As described above, an organic compound layer formed from a polymeric organic compound that is soluble in a protic solvent and a polymeric organic compound that is soluble in an aprotic solvent can be obtained by using wet etching and dry etching in combination.

BRIEF DESCRIPTION OF THE DRAWINGS

In the accompanying drawings:

FIGS. 7A to 7D are diagrams illustrating structures of light emitting elements of Embodiment 1;

DETAILED DESCRIPTION OF THE PREFERRED EMBODIMENTS

[Embodiment Mode]

An embodiment mode of the present invention will be described with reference to FIGS. 1A to 2D.

Figure 1A:
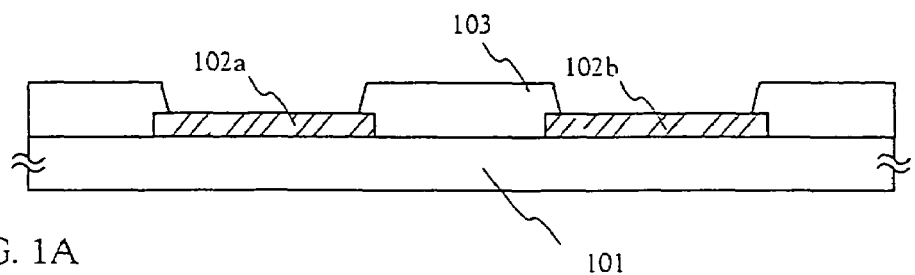
FIGS. 1A to 1E are diagrams illustrating a process of manufacturing a light emitting device according to the present invention.

As shown in FIG. 1A, a first anode 102a and a second anode 102b are formed on a substrate 101. The present invention uses for the substrate 101 glass or quartz that is transmissive of light, and uses a light-transmissive conductive material for the anodes 102 (102a and 102b).

An insulating layer 103 is formed from an insulating material so as to cover the ends of the anodes 102 (102a and 102b).

Figure 1B:
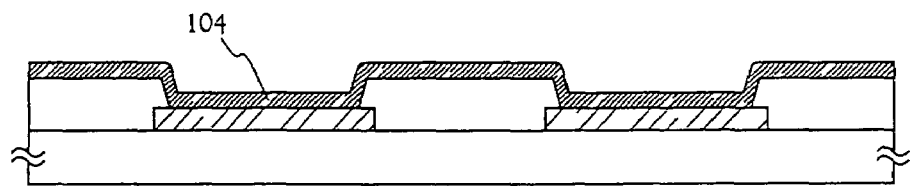

As shown in FIG. 1B, a first organic compound film is formed to cover the anodes 102 (102a and 102b) and the insulating layer 103. In this embodiment mode, the polymeric organic compound for forming the first organic compound film is PEDOT, which has a large work function and which is capable of injecting holes. PEDOT is dissolved in water and the obtained solution is applied by spin coating. The applied solution is heated at 100° C. for 5 to 15 minutes in the atmosphere or in vacuum to remove water, thereby obtaining a first organic compound film 104.

A second organic compound film 105 is formed on the first organic compound film 104. In this embodiment mode, the polymeric organic compound for forming the second organic compound film 105 can be a polyparaphenylene vinylene derivative, a polythiophene derivative, a polyfluolene derivative, a polyparaphenylene derivative, a polyalkylphenylene, a polyacetylene derivative, or the like. The derivatives given in the above are soluble in an aprotic solvent.

Figure 1C:
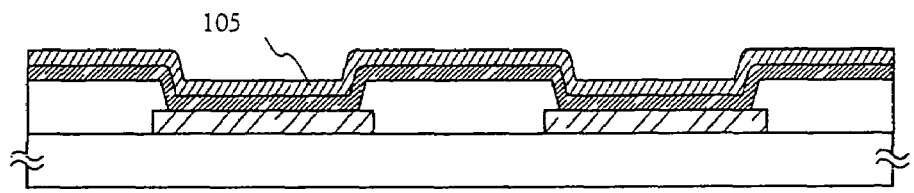
Figure 1D:
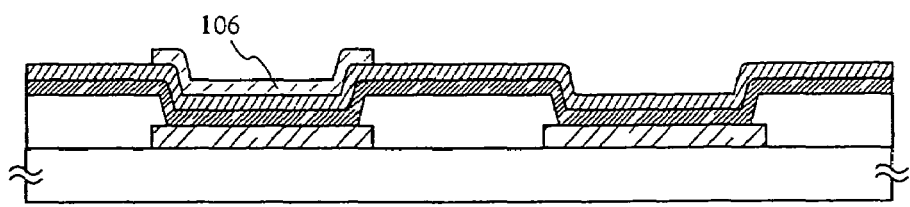

The polymeric organic compound of the second organic compound film may be poly(2,5-dialkoxy-1,4-phenylene vinylene) (denoted by RO-PPV). The compound is dissolved in toluene and the obtained solution is applied to the top face of the first organic compound film 104 by spin coating. The applied solution is heated at 80° C. for 3 minutes to remove toluene, thereby obtaining the second organic compound film 105 (FIG. 1C).

Next, a first cathode 106 is formed on the second organic compound film 105. The first cathode 106 here is formed by evaporation using a metal mask only at a position where the second organic compound film 105 overlaps the first anode 102a. The portion of the second organic compound film 105 is a part of an organic compound layer of a light emitting element that has the first anode 102a.

Regions of the second organic compound film that are not covered with the first cathode 106 and are left exposed on the surface are removed by wet etching. The etchant may be the aprotic solvent mentioned above. However, toluene is chosen here as the etchant and the regions are etched by ejecting toluene onto the substrate surface while spinning the substrate.

Figure 1E:
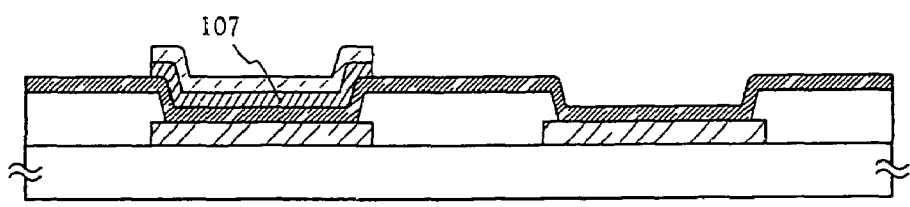

Through the wet etching treatment, only the region of the second organic compound film that is covered with the first cathode 106 remains while the other regions of the second organic compound film are removed. The region remaining after the etching is now called a second organic compound layer 107 (FIG. 1E).

Figure 2A:
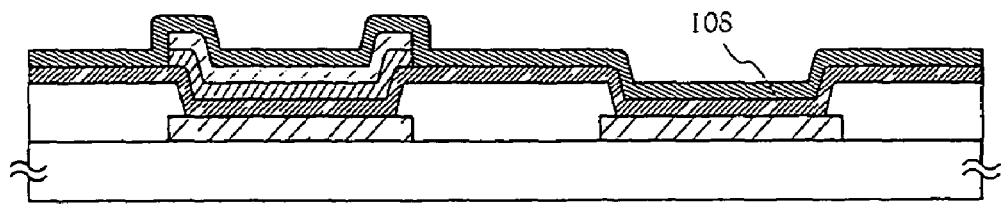
FIGS. 2A to 2D are diagrams illustrating a process of manufacturing a light emitting device according to the present invention.
Figure 2B:
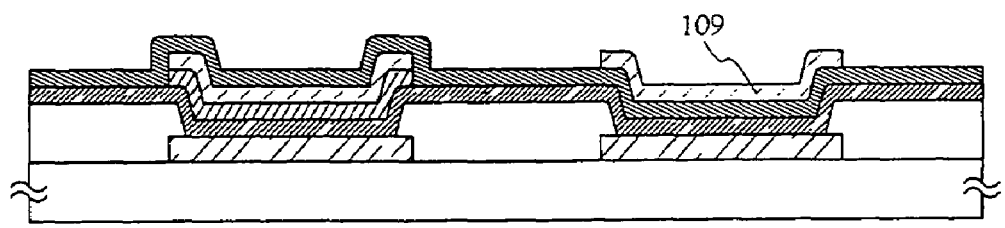

Next, a third organic compound film is formed on the first cathode 106 and the first organic compound film 104. The polymeric organic compound used here is poly (2-(dialkoxyphenyl)-1,4-phenylene vinylene) (denoted by ROPh-PPV). The compound is dissolved in toluene and the obtained solution is applied by spin coating to the top faces of the first organic compound film 104 and of the first cathode 106. The applied solution is heated at 80° C. for 3 minutes to remove toluene, thereby obtaining a third organic compound film 108 (FIG. 2A).

A second cathode 109 is formed on the third organic compound film 108. The second cathode 109 here is formed by evaporation using a metal mask only at a position where the third organic compound film 108 overlaps the second anode 102b. The portion of the third organic compound film 108 is a part of an organic compound layer of a light emitting element that has the second anode 102b.

Figure 2C:
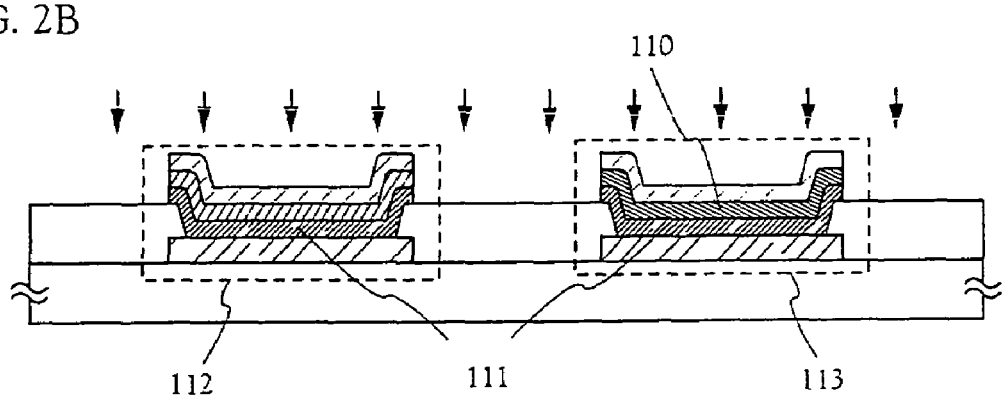

Regions of the third organic compound film that are not covered with the second cathode 109 are removed by dry etching treatment using $O_2$ plasma. The region covered with the second cathode and remaining after the etching is now called a third organic compound layer 110 (FIG. 2C).

In this dry etching treatment, the first organic compound film that is formed earlier is etched as well. Removed at this point are regions of the first organic compound film that are not covered with the first cathode 106 and with the second cathode 109. As a result, first organic compound layers 111 are formed at positions where the first organic compound film overlaps the first cathode 106 and the second cathode 109 as shown in FIG. 2C.

Through the above steps, a first light emitting element 112 and a second light emitting element 113 are obtained. The first light emitting element 112 is composed of: the first anode 102a; an organic compound layer consisting of one of the first organic compound layers 111 and the second organic compound layer 107; and the first cathode 106. The second light emitting element 113 is composed of: the second anode 102b; an organic compound layer consisting of the other of the first organic compound layers 111 and the third organic compound layer 110; and the second cathode 109.

Figure 2D:
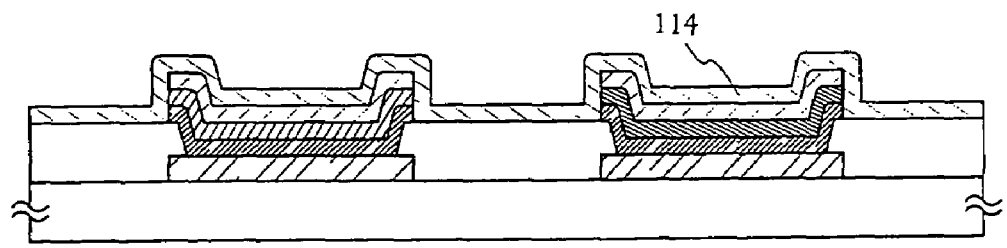

Then, auxiliary electrodes 114 are formed from a conductive material as shown in FIG. 2D. The auxiliary electrodes lower the film resistance of the cathodes (1106 and 109) and also provide connection wiring lines for connecting with the cathodes.

In this way, an organic compound layer is patterned using a cathode as an etching stopper and wet etching and dry etching are used in combination. This makes it possible to form a plurality of different organic compound layers in different light emitting elements that emit light of different colors on the same substrate.

Figure 3:
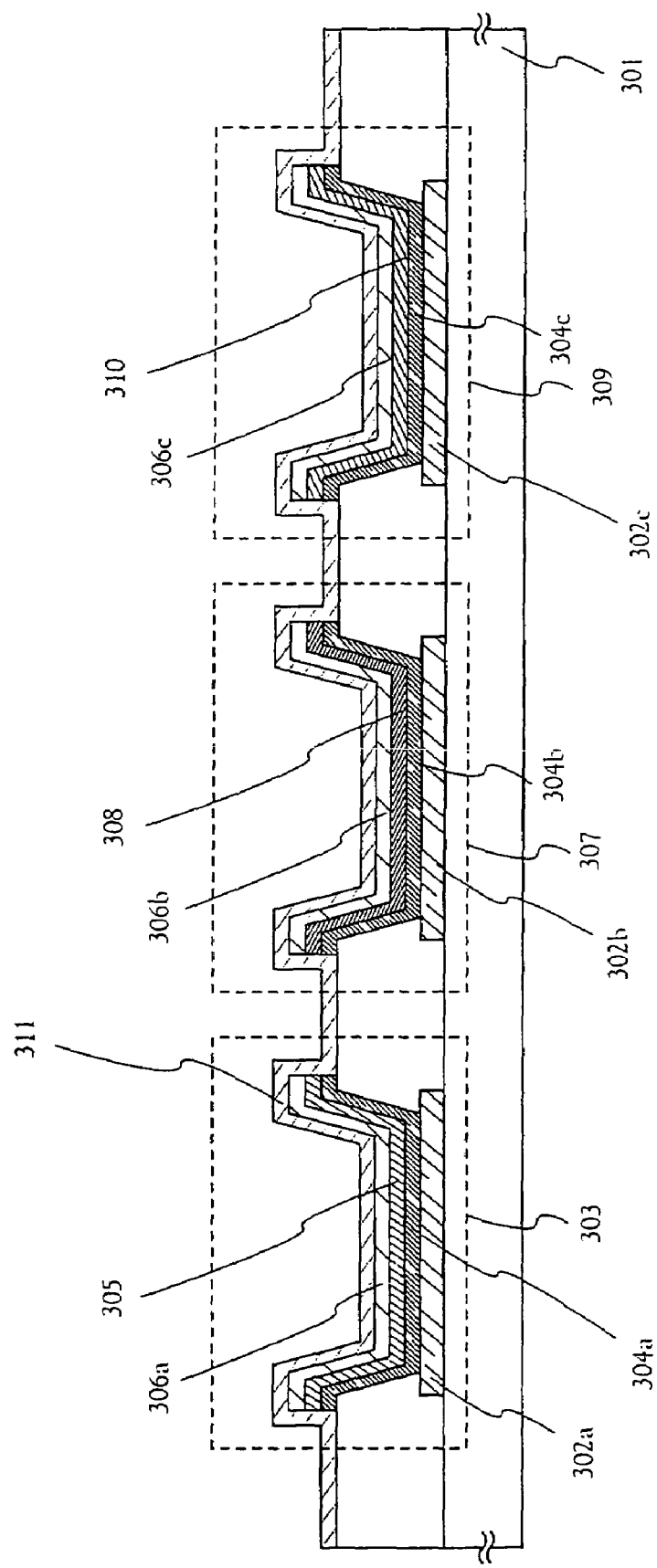
FIG. 3 is a diagram illustrating a structure of a pixel portion of a light emitting device of the present invention.

This embodiment mode describes a method of manufacturing two kinds of light emitting elements by forming two kinds of organic compound layers. However, the present invention is not limited thereto. As shown in FIG. 3, a light emitting device having three kinds of light emitting elements may be obtained from four kinds of polymeric organic compounds by repeating patterning of a cathode and wet etching treatment.

In FIG. 3, first to third anodes (302a to 302c) are formed on a substrate 301. A first light emitting element 303 has the first anode 302a on which a first organic compound layer 304a, a second organic compound layer 305, and a first cathode 306a are formed. A second light emitting element 307 has the second anode 302b on which a third organic compound layer 304b, a fourth organic compound layer 308, and a second cathode 306b are formed. A third light emitting element 309 has the third anode 302c on which a fifth organic compound layer 304c, a sixth organic compound layer 310, and a third cathode 306c are formed. Auxiliary electrodes 311 are formed from a conductive film and are in contact with the cathodes (306a to 306c) of the light emitting elements.

[Embodiment 1]

In this embodiment, an active matrix light emitting device is manufactured in accordance with a manufacturing method of the present invention.

Figure 4A:
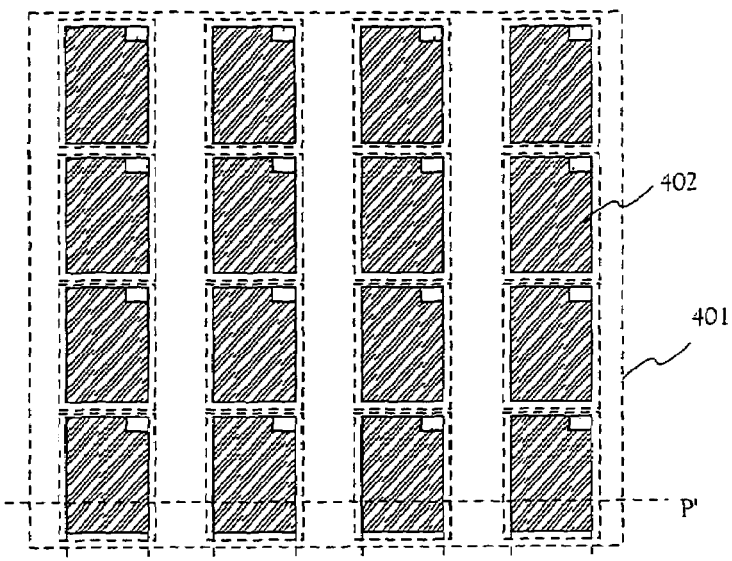
FIGS. 4A to 4E are diagrams illustrating a process of manufacturing a light emitting device according to Embodiment 1.
Figure 4B:
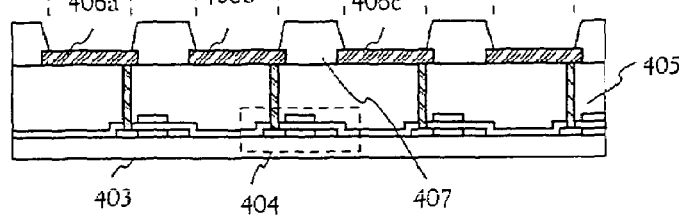

FIG. 4A shows a part of a pixel portion 401 formed on a substrate. The pixel portion 401 has a plurality of pixels 402 that form a matrix. FIG. 4B is a sectional view taken along the dotted line P–P' in the pixel portion 401 of FIG. 4A.

In FIG. 4B, a TFT 404 for driving a light emitting element (hereinafter referred to as current controlling TFT) is formed on a substrate 403.

This embodiment uses a glass substrate as the substrate 403 but any material can be employed for the substrate 403 as long as it can transmit light. The current controlling TFT 404 can be manufactured by a known TFT manufacturing method. The current controlling TFT 404 may be a top gate TFT or a bottom gate TFT.

An interlayer insulating film 405 is formed from an insulating material on the current controlling TFT 404. The insulating material used here may be one containing silicon, such as silicon oxide, silicon nitride, and silicon oxynitride, or an organic material such as polyimide, polyamide, acrylic, and polyimideamide may be employed. The thickness of the interlayer insulating film 405 may be 0.8 to 1.3 μm in this embodiment.

Next, a conductive film transmissive of light is formed to serve as anodes of light emitting elements. Here, an ITO (indium tin oxide) film is used. The material of the conductive film has to be larger in work function than the material of cathodes. Instead of the ITO film, a material having lower sheet resistance may he used. Specific examples thereof include platinum (Pt), chromium (Cr), tungsten (W), and nickel (Ni). The thickness of the conductive film is desirably 0.1 to 1 μm. The conductive film is then etched to form anodes 406 (first to third anodes 406a, 406b, and 406c).

An organic resin film is formed on the anodes 406 from polyimide, acrylic, or polyimideamide. Then an insulating layer 407 having openings above the anodes 406 is formed. Dry etching or wet etching can be used to form the openings. The insulating layer 407 covers the ends of the anodes 406. The edges of the insulating layer 407 may be tapered so that it is covered well with organic compound layers that are to be formed later.

Each current controlling TFT 404 formed earlier is electrically connected to one of the anodes 406 through one of the openings of the interlayer insulating film 405.

Next, a polymeric organic compound is dissolved in an aprotic solvent and the obtained solution is applied by spin coating. The polymeric organic compound used here is PEDOT, which is dissolved in water to prepare a solution. Desirably, the substrate to which the solution is to be applied is washed with ozone water or the like before application of the solution.

The substrate is then irradiated with ultraviolet rays for about 10 minutes to make the substrate surface hydrophilic. Desirably, enough $O_2$ is supplied during the ultraviolet irradiation.

Figure 4C:
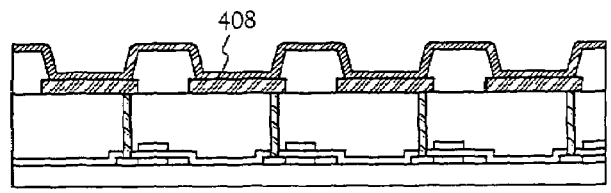
Figure 4D:
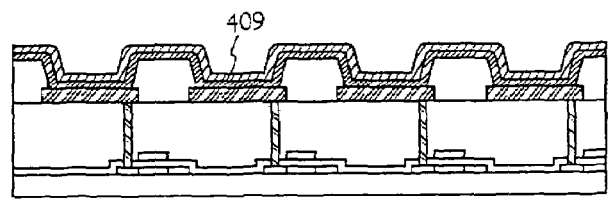
Figure 4E:
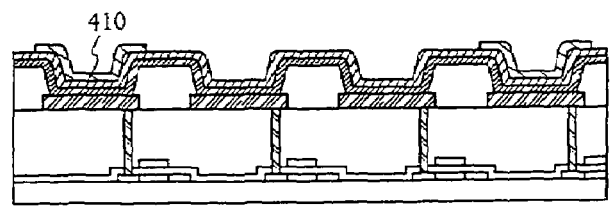

The spin coating lasts for 30 seconds with the number of spins set to 1500 rpm. Thus formed is a first organic compound film 408 with a thickness of 20 to 80 nm (FIG. 4C). After the film 408 is formed, heat treatment is conducted in the atmosphere or in vacuum at 100° C. for 5 to 15 minutes to remove water.

Next, a second organic compound film 409 is formed to serve as a light emitting layer of a first light emitting element. In this embodiment, the material of the second organic compound film 409 is poly(2-(dialkoxyphenyl)-1,4-phenylene vinylene) (denoted by ROPh-PPV) which emits green light. The compound is dissolved in toluene that is an aprotic solvent and the obtained solution is applied by spin coating. The film is then heated at 80° C. for 3 minutes to remove toluene, thereby obtaining the second organic compound film 409 with a thickness of 80 nm.

A first cathode 410 is formed by evaporation using a metal mask at a position where the second organic compound film overlaps the first anode 406a of the light emitting element that has the second organic compound film as its light emitting layer. The first cathode 410 is an Al:Li alloy film with a thickness of 100 to 120 nm. Other than the Al:Li alloy, a MgAg alloy may be used as the material of the cathode. Alternatively, the cathode may be a film formed by co-evaporation of aluminum and an element that belongs to Group 1 or 2 of the periodic table.

Figure 5A:
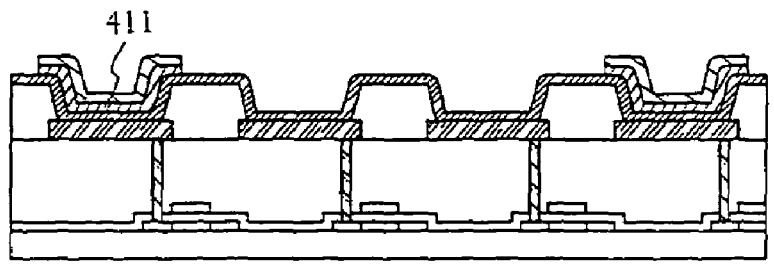
FIGS. 5A to 5D are diagrams illustrating a process of manufacturing a light emitting device according to Embodiment 1.
Figure 5B:
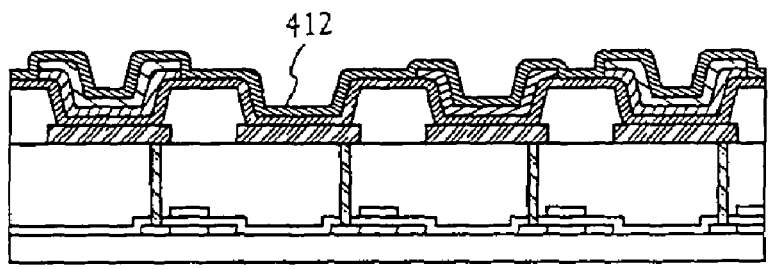
Figure 5C:
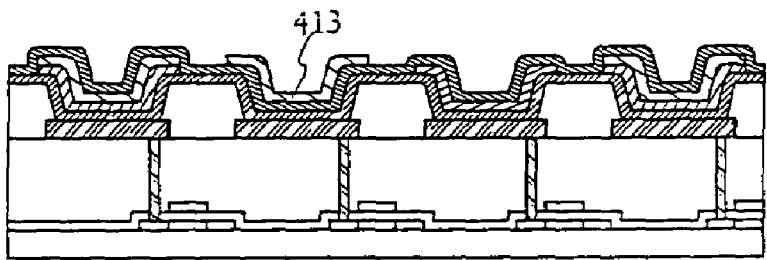

Regions of the second organic compound film that are not covered with the first cathode 410 and are left exposed on the surface are etched by ejecting toluene onto the regions through spin coating. After the etching, a second organic compound layer 411 is obtained as shown in FIG. 5A.

Next, a third organic compound film 412 is formed to serve as a light emitting layer of a second light emitting element. In this embodiment, the material of the third organic compound film 412 is poly(9,9'-dialkylfluorene) (denoted by PDAF) which emits blue light. The compound is dissolved in toluene and the obtained solution is applied by spin coating. The film is then heated at 80° C. for 3 minutes to remove toluene, thereby obtaining the third organic compound film 412 with a thickness of 80 nm.

A second cathode 413 is formed by evaporation using a metal mask at a position where the third organic compound film overlaps the second anode 406b of the light emitting element that has the third organic compound film as its light emitting layer. The second cathode 413 is an Al:Li alloy film, like in the case of the first cathode 410, with a thickness of 100 to 120 nm.

Figure 5D:
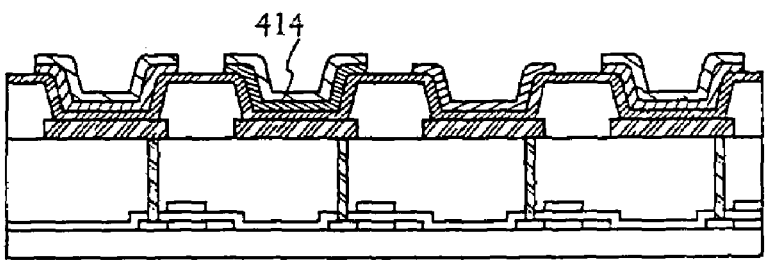

Regions of the third organic compound film that are not covered with the second cathode 413 and are left exposed on the surface are etched by ejecting toluene onto the regions through spin coating. After the etching, a third organic compound layer 414 is obtained as shown in FIG. 5D.

Next, a fourth organic compound film 415 is formed to serve as a light emitting layer of a third light emitting element. In this embodiment, the material of the fourth organic compound film 415 is poly(2,5-(dialkoxy)-1,4-phenylene vinylene) (denoted by RO—PPV) which emits red light. The compound is dissolved in toluene and the obtained solution is applied by spin coating. The film is then heated at 80° C. for 3 minutes to remove toluene, thereby obtaining the fourth organic compound film 415 with a thickness of 80 nm.

A third cathode 416 is formed by evaporation using a metal mask at a position where the fourth organic compound film overlaps the third anode 406c of the light emitting element that has the fourth organic compound film as its light emitting layer. The third cathode 416 is an Al:Li alloy film, like in the case of the first cathode 410, with a thickness of 100 to 120 nm.

Figure 6A:
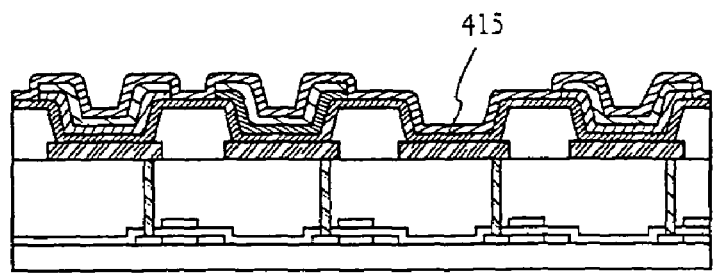
FIGS. 6A to 6D are diagrams illustrating a process of manufacturing a light emitting device according to Embodiment 1.
Figure 6B:
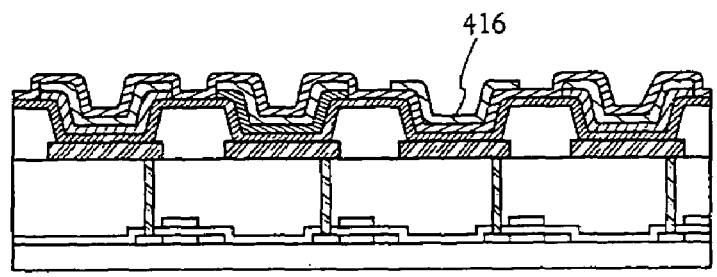
Figure 6C:
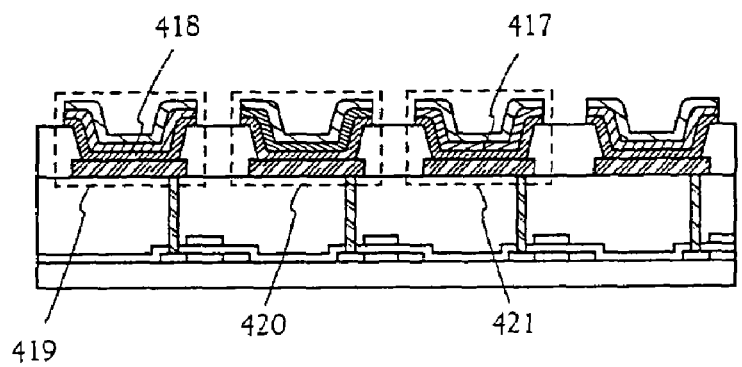

Regions of the fourth organic compound film that are not covered with the third cathode 416 and are left exposed on the surface, and regions of the previously formed first organic compound film 408 that do not overlap the first cathode 410, the second cathode 413, and the third cathode 416 are etched by irradiation of $O_2$ plasma. After the etching, a fourth organic compound layer 417 and a first organic compound layer 418 are obtained as shown in FIG. 6C.

In the $O_2$ plasma irradiation, 25 sccm of oxygen is introduced, the pressure is set to 2.2 Pa, and the RF power is set to 50 to 100 W/cm² to generate plasma for 1 to 2 minute treatment. The substrate temperature is set to room temperature.

Through the above steps, a first light emitting element 419, a second light emitting element 420, and a third light emitting element 421 are formed on the same substrate. The light emitting elements 419, 420, and 421 are different elements but each has an organic compound layer consisting of an organic compound layer (1) soluble in a protic solvent and an organic compound layer (2) soluble in an aprotic solvent between an anode and a cathode as shown in FIGS. 7A to 7D. The reference symbols in FIGS. 7A to 7D are the same as those used in FIGS. 4A to 6D so that cross reference can be made.

Figure 6D:
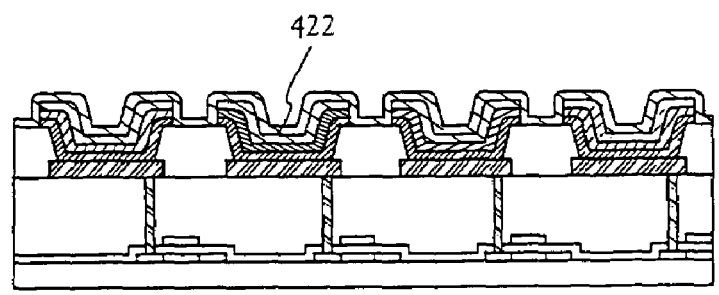

Next, auxiliary electrodes 422 are formed to cover the previously-formed light emitting elements as shown in FIG. 6D. The auxiliary electrodes 422 are formed from Al by evaporation to have a thickness of 120 nm. By forming the auxiliary electrodes 422 in this way, the resistance of the cathodes can be lowered.

[Embodiment 2]

Embodiment 1 shows an example of choosing a luminous polymeric organic compound that is soluble in an aprotic solvent from polymeric organic compounds that can be used to form organic compound layers. However, the present invention can employ a polymeric organic compound that has little or no solubility to an aprotic solvent if it can be dispersed in the aprotic solvent. It is also possible to mix an organic compound that does not emit light but has other functions in an organic compound layer. Organic compounds that can be used in the present invention are listed below.

Functions that the organic compounds in the present invention have other than light emission can be hole transportation function and electron transportation function. These materials are not necessarily polymeric organic compounds but may be low molecular weight organic compounds.

Examples of those compounds which are known as the material having the hole transportation, and which are aromatic amine-based, include N, N'-bis(3-methylphenyl)-N,N'-diphenyl-[1,1'-biphenyl]-4,4'-diamine (TPD); 4, 4'-bis [N-(1-naphthyl)-N-phenylamino]-biphenyl (hereafter referred to as "α-NPD"); and starburst type aromatic amine compounds. As the starburst type aromatic amine compounds, 4,4',4"-tris (N,N-diphenylamino)-triphenylamine (hereinafter referred to as, "TDATA"); and 4,4',4"-tris [N-(3-methylphenyl)-N-p henylamino]-triphenylamine (hereafter referred to as "MTDATA") can be used.

The materials having electron transportation include: metal complexes having quinoline skeleton or benzoquinoline skeleton, such as tris (8-quinolinolate) aluminum (hereinafter referred to as "Alq₃"), tris (4-methyl-8-quinolinolate) aluminum (hereinafter referred to as "Almq3"), and bis (10-hydroxybenzo[h]-quinolinate)beryllium (hereinafter referred to as "Bebq₂"), which are metal complexes; and bis (2-methyl-8-quinolinolate)-(4-hydroxy-biphe nylyl)aluminum (hereinafter referred to as "BAlq"), which are mixed ligand complexes. Those materials also include metal complexes having an oxazole-based or thiazole-based ligand such as bis [2-(2-hydroxypheyl)-benzoxazolate] zinc (hereinafter referred to as "Zn(BOX)₂") and bis [2-(2-hydroxypheyl)-benzothiazolate] zinc (hereinafter referred to as "Zn(BTZ)₂"). Furthermore, other those materials include, in addition to above-mentioned metal complexes, oxadiazole derivatives such as 2-(4-biphenylyl)-5-(4-tert-butylphenyl)-1,3,4-oxadiazole (hereinafter referred to as "PBD") and 1,3-bis [5-(p-tert-butylphenyl)-1,3,4-oxadiazole-2-yl]benzene (hereinafter referred to as "OXD-7"); triazole derivatives such as 3-(4-tert-butylphenyl)-4-phenyl-5-(4-biph enylyl) 1,2,4-triazole (hereinafter referred to as "TAZ") and 3-(4-tert-butylphenyl)-4-(4-ethylpheyl)-5-(4-biphenylyl)-1, 2,4-triazole (hereinafter referred to as "p-EtTAZ"); and phenanthroline derivatives such as bathophenanthroline (hereinafter referred to as "BPhen") and bathocuproine (hereinafter referred to as "BCP").

Also, fluorescent dyes and triplet light emitting materials may be used as the organic compound. Examples of the flourescent dyes include 4-(dicyanomethylene)-2-methyl-6-(p-dimethylaminostyryl)-4H-pyran (DCM), coumarin-540, rubrene, rhodamine 6G, perylene, quinacridone, pyrazoline, which are styryl dyes, and the like. Furthermore, tris (2-phenylpyridine) iridium (hereinafter referred to as "Ir(ppy)₃") and 2,3,7,8,12,13,17,18-octaethyl-21H, 23H-porphyrin-platinum (hereafter referred to as "PtOEP"), and the like are known as the triplet light emitting material.

Further, when the triplet light emitting materials are used, it is preferable to mix the above mentioned BAlq, OXD-7, TAZ, P-EtTAZ, Bphen, BCP, or the like thereto as a blocking material.

Further, it is also possible to use the high-molecule weight organic compounds mentioned below.

Namely, materials such as poly(1,4-phenylenevinylene), poly (1,4-naphthalenevinylene), poly (2-phenyl-1,4-phenylenevinylene), polythiophene, poly(3-phenylthiophene), poly(1,4-phenylene), poly(2,7-fluorene), or the like can be used as the organic compound.

By using in combination the above materials having different functions, an organic light emitting element that is lower in drive voltage and longer in lifetime than prior art can be obtained. The structure of this embodiment may be combined freely with the structure of Embodiment 1.

[Embodiment 3]

Figure 8A:
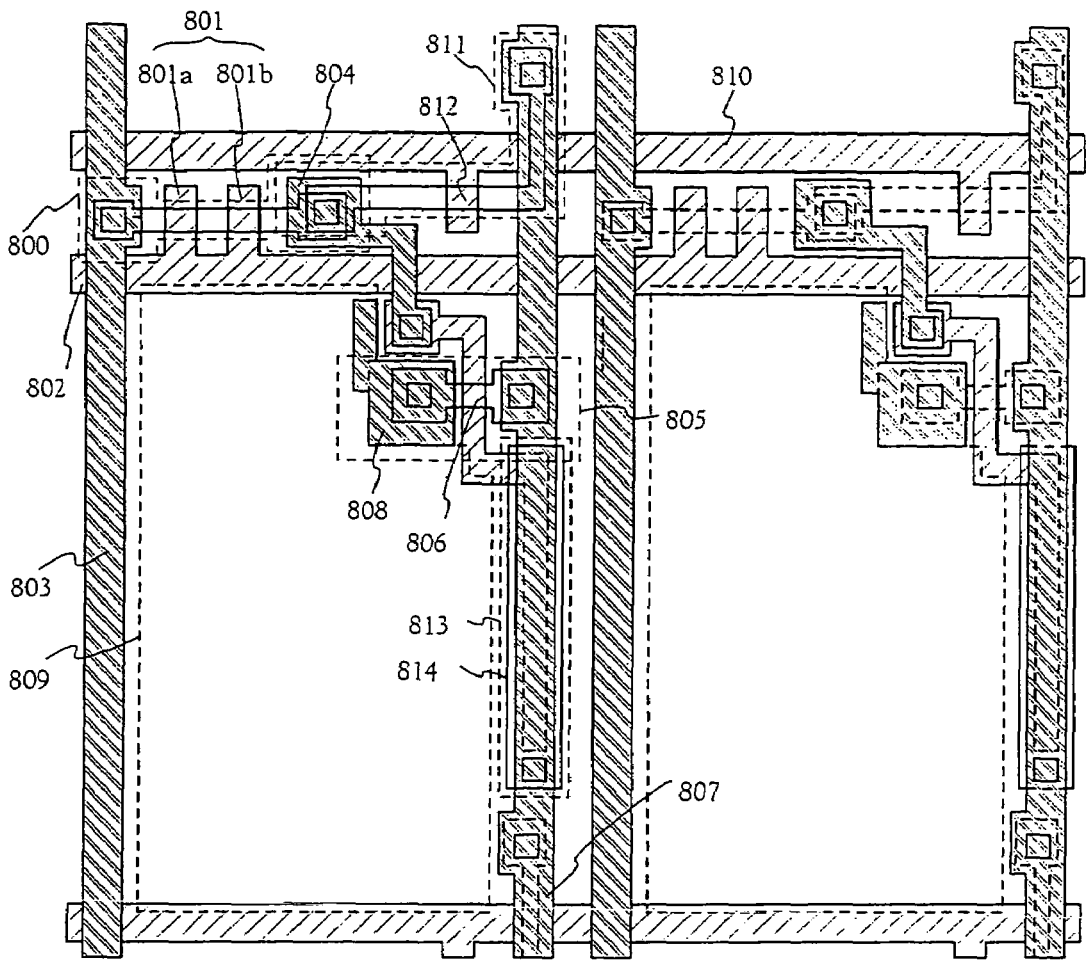
FIGS. 8A and 8B are top views of a pixel portion of a light emitting device of Embodiment 3.
Figure 8B:
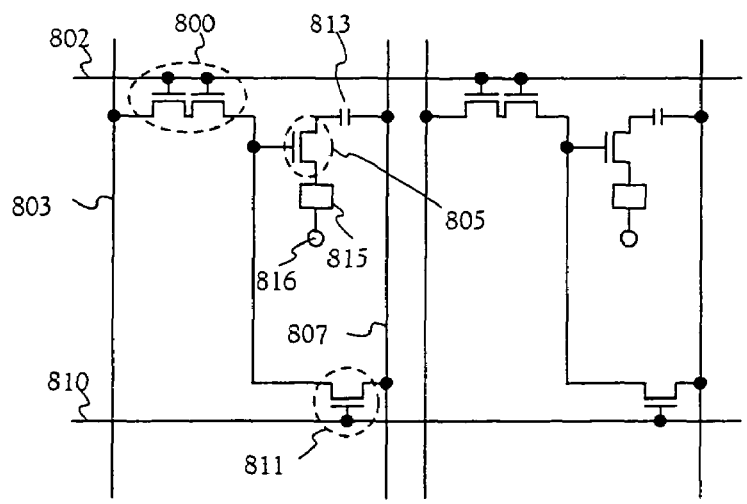

FIG. 8A shows a detailed top structure of the pixel portion of the light emitting device manufactured in accordance with the present invention in Embodiment 1. FIG. 8B shows a circuit diagram thereof. The same reference symbols are used in FIGS. 8A and 8B so that cross reference can be made.

In this embodiment, a TFT in a region denoted by 800 is called a switching TFT and a TFT in a region denoted by 805 is called a current controlling TFT. The switching TFT 800 has a source connected to a source signal line 803 and has a drain connected to a drain wiring line 804. The drain wiring line 804 is electrically connected to a gate electrode 806 of the current controlling TFT 805.

The switching TFT 800 has a channel formation region, which is in contact with the source and drain regions of the switching TFT 800. The channel formation region overlaps a gate electrode 801 (801a and 801b) that is electrically connected to a gate signal line 802.

The current controlling TFT 805 has a source electrically connected to a current supplying line 807 and has a drain electrically connected to a drain wiring line 808. The drain wiring line 808 is electrically connected to an anode (pixel electrode) 809 indicated by the dotted line. Note, reference numeral 813 denotes a capacitor, and 814 is a semiconductor film which act as an electrode thereof. Reference numeral 812 indicates an erasing TFT having a gate electrode 812. A gate wiring 810 is electrically connected to the gate electrode 812. Reference numerals 815 and 816 are a light emitting element and an opposing power source, respectively. The current control TFT 805 is electrically connected to the capacitor 813 and the light emitting element 815.

The structure of this embodiment may be combined freely with the structure of Embodiment 1 or 2.

[Embodiment 4]

Figure 9A:
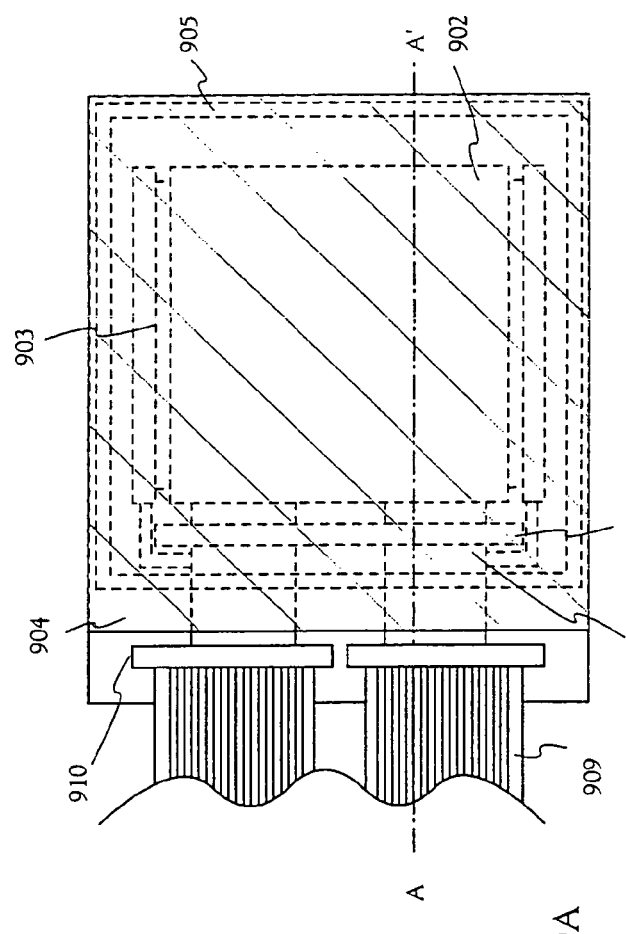
FIGS. 9A and 9B are diagrams illustrating an active matrix light emitting device of Embodiment 4.
Figure 9B:
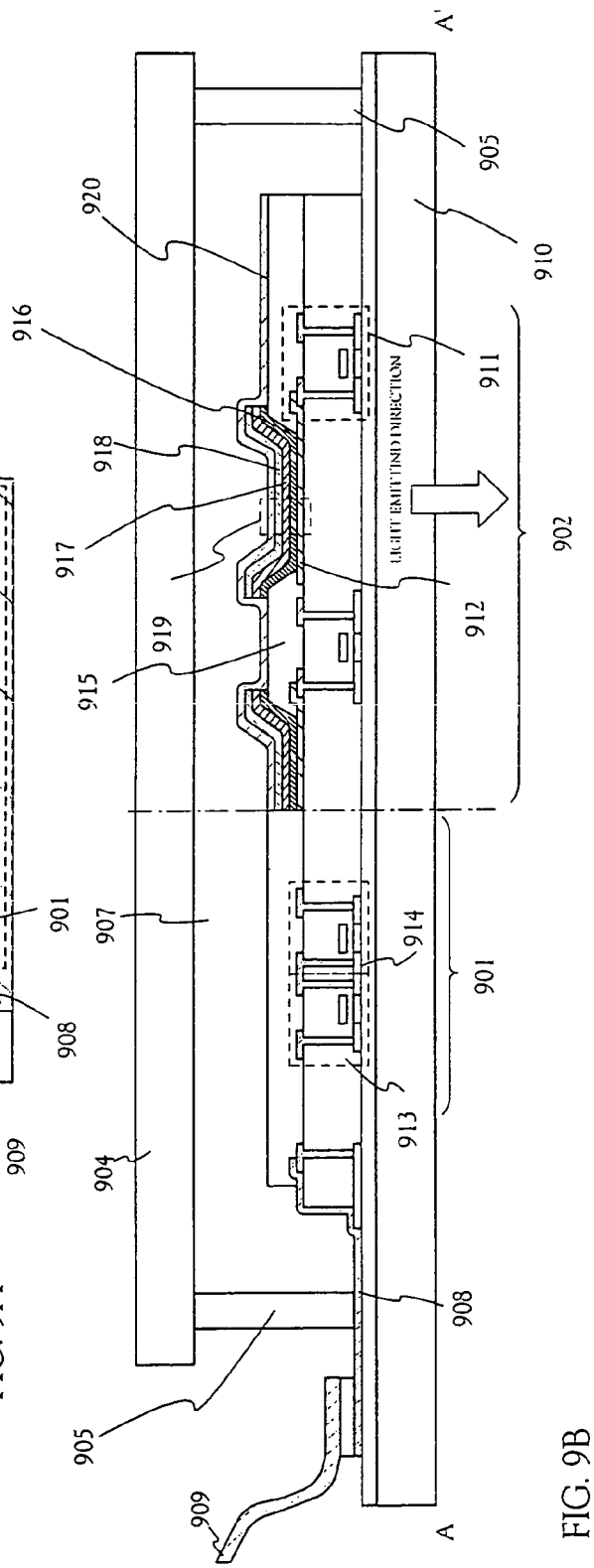

Referring to FIGS. 9A and 9B, the external appearance of a light emitting device of the present invention will be described in the present example. FIG. 9A is a top view of the luminescent device, and FIG. 9B is a sectional view taken on line A–A' of FIG. 9A. Shown by dotted lines, reference numeral 901 represents a source signal line driving circuit, 902, a pixel portion; and 903, a gate signal line driving circuit; 904, a cover member; and 905, a sealing agent. A space is surrounded by the sealing agent 905.

Reference number 908 represents an interconnection for transmitting signals inputted to the source signal line driving circuit 901 and the gate signal line driving circuit 903. The interconnection 908 receives video signals or clock signals from a flexible print circuit (FPC) 909, which will be an external input terminal. Only the FPC is illustrated, but a printed wiring board (PWB) may be attached to this FPC. The light emitting device referred to in the present specification may be the body of the light emitting device, or a product wherein an FPC or a PWB is attached to the body.

The following will describe a sectional structure, referring to FIG. 9B. The driving circuits and the pixel section are formed on the substrate 910, but the source signal line driving circuit 901 as one of the driving circuits and the pixel section 902 are shown in FIG. 9B.

In the source signal line driving circuit 901, a CMOS circuit wherein an n-channel type TFT 913 and a p-channel type TFT 914 are combined is formed. The TFTs constituting the driving circuit may be composed of known CMOS circuits, PMOS circuits or NMOS circuits. In the present example, a driver-integrated type, wherein the driving circuit is formed on the substrate, is illustrated, but the driver-integrated type may not necessarily be adopted. The driver may be fitted not to the substrate but to the outside.

The pixel portion 902 is composed of a plurality of pixels each of which includes a current controlling TFT 911 and an anode 912. The anode 912 is electrically connected to a drain of the current controlling TFT 911.

An insulating layer 915 is formed on each end of the anode 912. An organic compound layer composed of a first organic compound layer 916 and a second organic compound layer 917 is formed on the anode 912. A cathode 918 is formed on the second organic compound layer 917. An auxiliary electrode 920 can be formed on the cathode 918. Thus completed is a light emitting element 919 composed of the anode, the organic compound layer, and the cathode.

The cathode 918 also functions as a common wiring line shared by all the pixels and is electrically connected to the FPC 909 through the connection wiring line 908.

The cover member 904 is bonded to the substrate 910 with the sealing agent 905 in order to seal the light emitting element 919 formed over the substrate 910. Spacers formed from a resin film may be provided to keep the distance between the cover member 904 and the light emitting element 919. The space 907 inside the sealing agent 905 is filled with inert gas such as nitrogen. The sealing agent 905 is preferably an epoxy resin. Desirably, the material of the sealing agent 905 is one that allows as little moisture and oxygen as possible to transmit. A hygroscopic substance or an anti-oxidizing substance may be placed in the space 907.

In this embodiment, a glass substrate or a quartz substrate is used as the cover member 904. Alternatively, the cover member may be a plastic substrate that is formed of FRP (fiberglass-reinforced plastics), PVF (polyvinyl fluoride), Mylar, polyester, acrylic, or the like. After the cover member 904 is bonded to the substrate 910 using the sealing agent 905, the side faces (exposed faces) of the device may be further covered and sealed by the sealing agent.

By sealing the light emitting element in the space 907 as described above, the light emitting element is completely shut off from the outside and external substances that accelerate degradation of the organic compound layer, such as moisture and oxygen, can be prevented from entering the light emitting element. Therefore, a highly reliable light emitting device can be obtained.

The structure of this embodiment may be freely combined with any of the structures of Embodiments 1 through 3.

[Embodiment 5]

Figure 10:
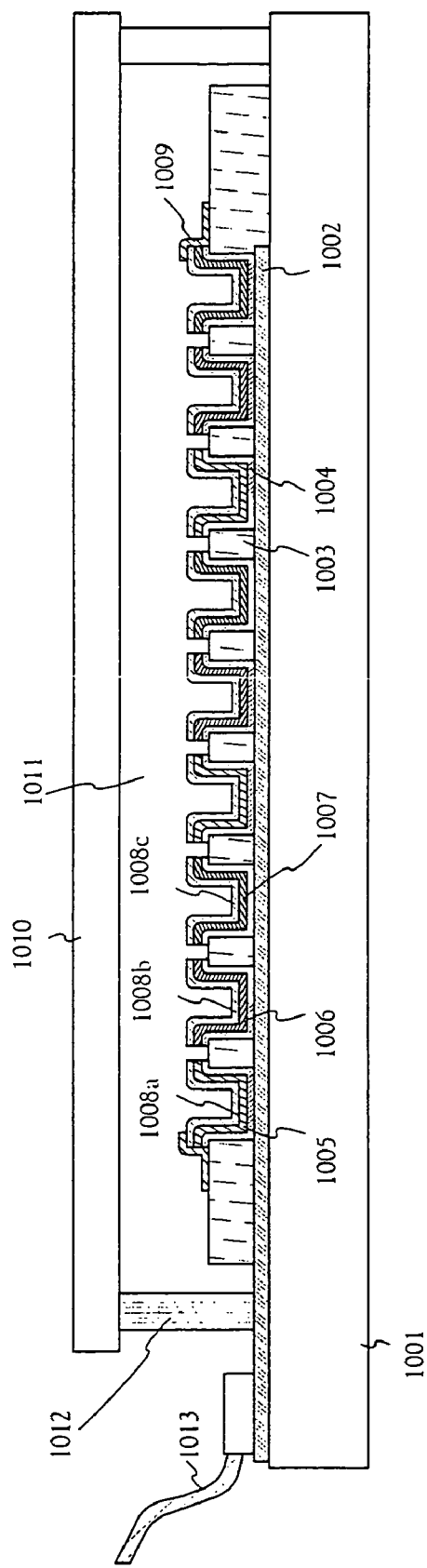
FIG. 10 is a diagram illustrating a passive matrix light emitting device of Embodiment 5.

This embodiment describes a case of manufacturing a passive (simple matrix) light emitting device in accordance with a manufacturing method of the present invention. The description is given with reference to FIG. 10. In FIG. 10, reference numeral 1001 denotes a glass substrate and 1002 denotes anodes formed from a transparent conductive film. In this embodiment, the transparent conductive film is formed by evaporation from a compound of indium oxide and zinc oxide. Though not shown in FIG. 10, a plurality of anodes 1002 are arranged to form a stripe pattern in the direction perpendicular to the surface of the drawing paper.

Banks 1003 are formed to intersect the anodes 1002 arranged to form a stripe pattern. The banks 103 are in contact with the anodes 1002 and are perpendicular to the surface of the drawing paper.

Next, an organic compound layer having a laminate structure is formed. In this embodiment, first, PEDOT is dissolved in water and the obtained solution is applied by spin coating. The applied solution is heated at 100° C. for 5 to 15 minutes in the atmosphere or in vacuum to remove water, thereby obtaining a first organic compound film with a thickness of 30 to 50 nm.

Next, a second organic compound film (not shown) is formed to have a thickness of 50 to 150 nm. For the second organic compound film, poly(2-(dialkoxyphenyl)-1,4-phenylene vinylene) (denoted by ROPh-PPV) is dissolved in toluene and the obtained solution is applied by spin coating and then heated at 80° C. for 3 minutes to vaporize the solvent.

A first cathode 1008a is formed next. The first cathode 1008a formed here uses a metal mask only in a region where a light emitting element that has the second organic compound film is formed.

After the first cathode 1008a is formed, wet etching is conducted using toluene. Regions of the second organic compound film that are not covered with the first cathode 1008a are etched by ejecting toluene onto the substrate through spin coating. Toluene used as the etchant can be vaporized by heating the substrate at 80° C. for 3 minutes again after the etching. As a result, a second organic compound layer 1005 can be obtained.

After the etching is finished, a third organic compound film (not shown) is formed to have a thickness of 50 to 150 nm. For the third organic compound film, poly (9,9'-dialkyl fluorene) (denoted by PDAF) is dissolved in toluene and the obtained solution is applied by spin coating and then heated at 80° C. for 3 minutes to vaporize the solvent.

A second cathode 1008b is formed next. The second cathode 1008b formed here uses a metal mask only in a region where a light emitting, element that has the third organic compound film is formed.

After the second cathode 1008b is formed, wet etching is conducted using toluene similarly. Toluene used as the etchant can be vaporized by heating the substrate at 80° C. for 3 minutes similarly after the etching. As a result, a third organic compound layer 1006 can be obtained.

After the etching is finished, a fourth organic compound film (not shown) is formed to have a thickness of 50 to 150 nm. For the fourth organic compound film, poly(2,5-dialkoxy-1,4-phenylene vinylene) (denoted by RO-PPV) is dissolved in toluene and the obtained solution is applied by spin coating and then heated at 80° C. for 3 minutes to vaporize the solvent.

A third cathode 1008c is formed next. The third cathode 1008c formed here uses a metal mask only in a region where a light emitting element that has the fourth organic compound film is formed.

After the third cathode 1008c is formed, dry etching is conducted using $O_2$ plasma. The dry etching removes regions of the fourth organic compound film that are not covered with the third cathode 1008c and regions of the previously-formed first organic compound film as well. As a result, a fourth organic compound layer 1007 and a first organic compound layer 1004 can be obtained.

Through the above steps, light emitting elements each having a plurality of organic compound layers are obtained. In this embodiment, a laminate of the first organic compound layer and the second organic compound layer, a laminate of the first organic compound layer and the third organic compound layer, and a laminate of the first organic compound layer and the fourth organic compound layer are equally referred to as organic compound layer. These organic compound layers are formed a long the groove between the banks 1003 and therefore are arranged to form a stripe pattern in the direction perpendicular to the top face of the drawing paper.

A connection wiring line 1009 for electrically connecting the first cathode 1008a, the second cathode 1008b, and the third cathode 1008c are formed by evaporation. The material of the connection wiring line is A1 in this embodiment.

The light emitting elements are formed on the substrate 1001 through the above steps. In this embodiment, the lower electrode is an anode transmissive of light and therefore light emitted from the organic compound layers travels downward (toward the substrate 1001).

Next, a ceramic substrate is prepared as a cover member 1010. The ceramic substrate is chosen because the structure of this embodiment does not need a light-transmissive cover member. However, a plastic substrate or a glass substrate may be used as the cover member 1010.

The cover member 1010 is bonded to the substrate 1001 using, a sealing, agent 1012 that is a UV-curable resin. Inside the sealing, agent 1012 is a sealed space 1011, which is filled with inert gas such as nitrogen or argon. It is effective to place a hygroscopic material, typically, barium oxide, in the sealed space 1011. Lastly, an anisotropic conductive film (FPC) 1013 is attached to the substrate to complete a passive light emitting device. The organic compound layers of this embodiment can be formed using any combination of the materials given in Embodiment 1 or 2.

[Embodiment 6]

The light emitting device fabricated in accordance with the present invention is of the self-emission type, and thus exhibits more excellent recognizability of the displayed image in a light place as compared to the liquid crystal display device. Furthermore, the light emitting device has a wider viewing angle. Accordingly, various electronic devices can be completed by using the light emitting device of the present invention to a display portion.

Such electronic devices manufactured by the present invention include a video camera, a digital camera, a goggles-type display (head mount display), a navigation system, a sound reproduction device (a car audio equipment, an audio set and the like), a laptop personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light emitting device with a light emitting element is preferable, since the portable information terminal that is likely to be viewed from a tilted direction is often required to have a wide viewing angle. FIGS. 11A to 11H respectively show various specific examples of such electronic devices.

Figure 11A:
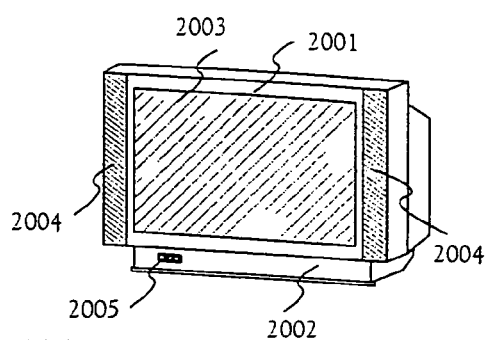
FIGS. 11A to 11H are diagrams showing examples of electronic apparatuses of Embodiment 6.

FIG. 11A illustrates a display device which includes a frame 2001, a support table 2002, a display portion 2003, a speaker portion 2004, a video input terminal 2005 or the like. The light emitting device manufactured by the present invention can be used for the display portion 2003. The light-emitting device is of the self-emission type and therefore requires no back light. Thus, the display portion thereof can have a thickness thinner than that of the liquid crystal display device. The display device is including all of the display device for displaying information, such as a personal computer, a receiver of TV broadcasting and an advertising display.

Figure 11B:
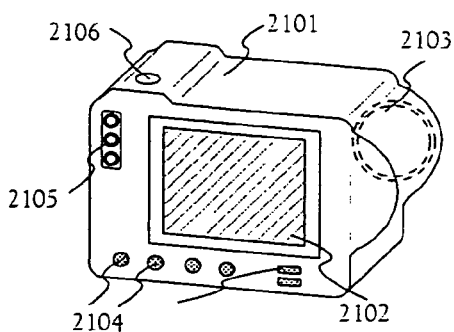

FIG. 11B illustrated a digital still camera which includes a main body 2101, a display portion 2102, an image receiving portion 2103, an operation key 2104, an external connection port 2105, a shutter 2106, or the like. The light emitting device manufactured by the present invention can be used for the display portion 2102.

Figure 11C:
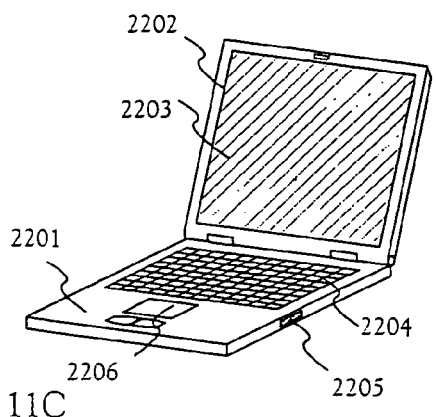

FIG. 11C illustrates a laptop type (notebook type) personal computer which includes a main body 2201, a casing 2202, a display portion 2203, a keyboard 2204, an external connection port 2205, a pointing mouse 2206, or the like. The light emitting device manufactured by the present invention can be used to the display portion 2203.

Figure 11D:
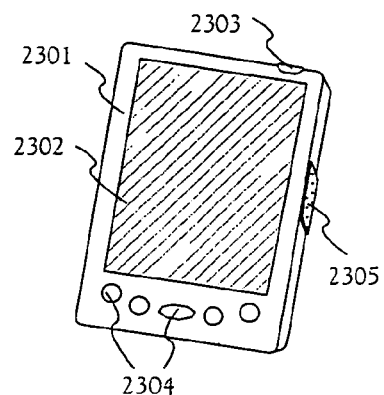

FIG. 11D illustrated a mobile computer which includes a main body 230, a display portion 2302, a switch 2303, an operation key 2304, an infrared port 2305, or the like. The light emitting device manufactured by the present invention can be used to the display portion 2302.

Figure 11E:
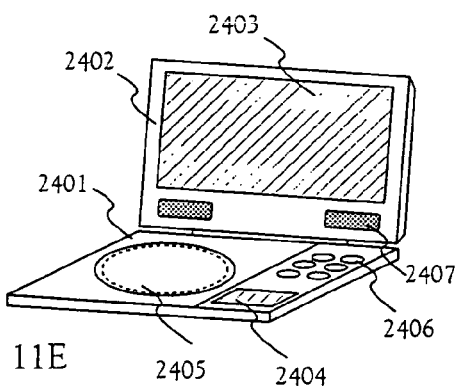

FIG. 11E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light emitting device manufactured by the present invention can be used to the display potion A 2403 and the display portion B 2404. Note that the image reproduction apparatus including a recording medium further includes a domestic game machine or the like.

Figure 11F:
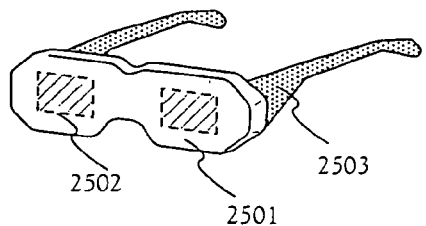

FIG. 11F illustrates a goggle type display (head mounted display) which includes a main body 2501, a display portion 2502, an arm portion 2503. The light emitting device manufactured by the present invention can be used to the display portion 2502.

Figure 11G:
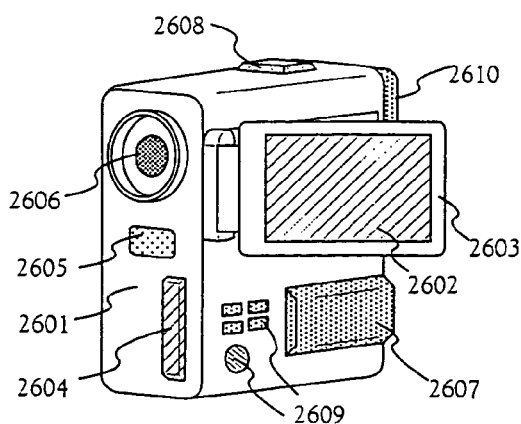

FIG. 11G illustrates a video camera which includes a main body 2601, a display portion 2602, an casing 2603, an external connecting port 2604, a remote control receiving portion 2605, an image receiving portion 2606, a battery 2607, a sound input portion 2608, an operation key 2609, an eye contact potion 2610 or the like. The light emitting device manufactured by the present invention can be used to the display portion 2602.

Figure 11H:
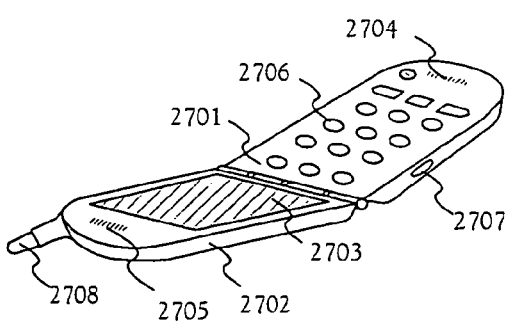

FIG. 11H illustrates a mobile phone which includes a main body 2701, a casing 2702, a display portion 2703, a sound input portion 2704, a sound output portion 2705, an operation key 2706, an external connecting port 2707, an antenna 2708, or the like. The light emitting device manufactured by the present invention can be used to the display portion 2703. Note that the display portion 2703 can reduce power consumption of the portable telephone by displaying white-colored characters on a black-colored background.

When the brighter luminance of the organic material becomes available in the future, the light emitting device manufactured by the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light emitting device is suitable for displaying moving pictures since the organic material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

As set forth above, the light emitting device formed by using the present invention can be applied variously to a wide range of electronic devices in all fields. The electronic device in the present embodiment can be completed by using a light emitting device shown in Embodiments 1 through 5 to the display portion.

According to the manufacturing method of the present invention, different organic compound layers each containing a plurality of polymeric materials can be formed in different light emitting elements on the same substrate. In the present invention, conventional spin coating can be used to form a polymeric material into a film and therefore more uniform film than a film formed by the ink jet method can be obtained. Furthermore, the present invention does not need special devices to form a polymeric material into a film and accordingly it is easy to carry out.

What is claimed is:

1. A light emitting device comprising:
a first light emitting element including:
a first anode;
a first organic compound layer in contact with the first anode;
a second organic compound layer in contact with the first organic compound layer;
a first cathode in contact with the second organic compound layer;
a second light emitting element including:
a second anode;
a third organic compound layer in contact with the second anode;
a fourth organic compound layer in contact with the third organic compound layer;
a second cathode in contact with the fourth organic compound layer;
a third light emitting element including:
a third anode;
a fifth organic compound layer in contact with the third anode;
a sixth organic compound layer in contact with the fifth organic compound layer;
a third cathode in contact with the sixth organic compound layer; and
one auxiliary electrode covering all of an end of the first cathode, an end of the second cathode and an end of the third cathode.

2. A device according to claim 1,
wherein each of the first, third and fifth organic compound layers comprises at least one selected from the group consisting of PEDOT and polyaniline.

3. A device according to claim 1,
wherein each of the second, fourth and sixth organic compound layers comprises at least one selected from the group consisting of a polyparaphenylene vinylene derivative, a polythiophene derivative, a polyfluorene derivative, a polyparaphenylene derivative, a polyalkylphenylene and a polyacetylene derivative.

4. A device according to claim 1,
wherein each of the second, fourth and sixth organic compound layers comprises at least one selected from the group consisting of poly(2,5-dialkoxy-1,4-phenylenevinylene), poly (2-dialkoxyphenyl-1,4-phenylenevinylene), poly (2-methoxy-5-(2-ethyl-hexoxy)-1,4-phenylenevinylene), poly(2,5-dimethyloctylsilyl-1,4-phenylenevinylene), poly(2,5-dialkoxy-1,4-phenylene), poly(3-alkylthiophene), poly(3-hexylthiophene), poly(3-cyclohexylthiophene), poly(3-cyclohexyl-4-methylthiophene), poly(3-[4-octylphenyl]-2,2'-bithiophene), poly(3-(4-octylphenyl)-thiophene), poly(dialkylfluorene), poly (dioctylfluorene), polypropylphenylacetylene, poly[1-(p-n-butylphenyl)-2-phenylacetylene, and polyhexylphenylacetylene.

5. A device according to claim 1,
wherein the light emitting device is one selected from the group consisting of a display device, a digital still camera, a notebook type personal computer, a mobile computer, an image reproduction apparatus including a recording medium, a goggle type display, a video camera, and a mobile phone.

6. A light emitting device according to claim 1, wherein the auxiliary electrode comprises Al.

7. A light emitting device according to claim 1, wherein the first, second and third cathodes comprise an Al:Li alloy.

8. A light emitting device according to claim 1, wherein each of the first, second, and third anodes is electrically connected to a TFT.

9. A light emitting device comprising:
a first light emitting element including:
a first anode;
a first organic compound layer in contact with the first anode;
a second organic compound layer in contact with the first organic compound layer;
a first cathode in contact with the second organic compound layer;
wherein each of the first and second organic compound layers is overlapped with the first cathode;
a second light emitting element including:
a second anode;
a third organic compound layer in contact with the second anode;
a fourth organic compound layer in contact with the third organic compound layer;
a second cathode in contact with the fourth organic compound layer;
wherein each of the third and fourth organic compound layers is overlapped with the second cathode;
a third light emitting element including:
a third anode;
a fifth organic compound layer in contact with the third anode;
a sixth organic compound layer in contact with the fifth organic compound layer;
a third cathode in contact with the sixth organic compound layer;
wherein each of the fifth and sixth organic compound layers is overlapped with the third cathode; and
one auxiliary electrode covering all of the first, second and third cathodes, wherein the first, second and third cathodes are separated from each other.

10. A device according to claim 9,
wherein each of the first, third and fifth organic compound layers comprises at least one selected from the group consisting of PEDOT and polyaniline.

11. A device according to claim 9,
wherein each of the second, fourth and sixth organic compound layers comprises at least one selected from the group consisting of a polyparaphenylene vinylene derivative, a polythiophene derivative, a polyfluorene derivative, a polyparaphenylene derivative, a polyalkylphenylene and a polyacetylene derivative.

12. A device according to claim 9,
wherein each of the second, fourth and sixth organic compound layers comprises at least one selected from the group consisting of poly(2,5-dialkoxy-1,4-phenylenevinylene), poly (2-dialkoxyphenyl-1,4-phenylenevinylene), poly (2-methoxy-5-(2-ethyl-hexoxy)-1,4-phenylenevinylene), poly(2,5-dimethyloctylsilyl-1,4-phenylenevinylene), poly(2,5-dialkoxy-1,4-phenylene), poly(3-alkylthiophene), poly(3-hexylthiophene), poly(3-cyclohexylthiophene), poly(3-cyclohexyl-4-methylthiophene), poly(3-[4-octylphenyl]-2,2'-bithiophene), poly(3-(4-octylphenyl)-thiophene), poly(dialkylfluorene), poly(dioctylfluorene), polypropylphenylacetylene, poly[1-(p-n-butylphenyl)-2-phenylacetylene, and polyhexylphenylacetylene.

13. A device according to claim 9,
wherein the light emitting device is one selected from the group consisting of a display device, a digital still camera, a notebook type personal computer, a mobile computer, an image reproduction apparatus including a recording medium, a goggle type display, a video camera, and a mobile phone.

14. A light emitting device according to claim 9, wherein the auxiliary electrode comprises Al.

15. A light emitting device according to claim 9, wherein the first, second and third cathodes comprise an Al:Li alloy.

16. A light emitting device according to claim 9, wherein each of the first, second, and third anodes is electrically connected to a TFT.

17. A light emitting device comprising:
a first light emitting element including:
a first anode;
a first organic compound layer in contact with the first anode;
a second organic compound layer in contact with the first organic compound layer;
a first cathode in contact with the second organic compound layer;
a second light emitting element including:
a second anode;
a third organic compound layer in contact with the second anode;
a fourth organic compound layer in contact with the third organic compound layer;
a second cathode in contact with the fourth organic compound layer;
a third light emitting element including:
a third anode;
a fifth organic compound layer in contact with the third anode;
a sixth organic compound layer in contact with the fifth organic compound layer;
a third cathode in contact with the sixth organic compound layer; and
one conductive film in contact with all of the first, second and third cathodes and the first, second, third, fourth, fifth and sixth organic compound layers.

18. A device according to claim 17,
wherein each of the first, third and fifth organic compound layers comprises at least one selected from the group consisting of PEDOT and polyaniline.

19. A device according to claim 17,
wherein each of the second, fourth and sixth organic compound layers comprises at least one selected from the group consisting of a polyparaphenylene vinylene derivative, a polythiophene derivative, a polyfluorene derivative, a polyparaphenylene derivative, a polyalkylphenylene and a polyacetylene derivative.

20. A device according to claim 17,
wherein each of the second, fourth and sixth organic compound layers comprises at least one selected from the group consisting of poly(2,5-dialkoxy-1,4-phenylenevinylene), poly (2-dialkoxyphenyl-1,4-phenylenevinylene), poly (2-methoxy-5-(2-ethyl-hexoxy)-1,4-phenylenevinylene), poly(2,5-dimethyloctylsilyl-1,4-phenylenevinylene), poly(2,5-dialkoxy-1,4-phenylene), poly(3-alkylthiophene), poly(3-hexylthiophene), poly(3-cyclohexylthiophene), poly(3-cyclohexyl-4-methylthiophene), poly(3-[4-octylphenyl]-2,2'-bithiophene), poly(3-(4-octylphenyl)-thiophene), poly(dialkylfluorene), poly(dioctylfluorene), polypropylphenylacetylene, poly[1-(p-n-butylphenyl)-2-phenylacetylene, and polyhexylphenylacetylene.

21. A device according to claim 17,
wherein the light emitting device is one selected from the group consisting of a display device, a digital still camera, a notebook type personal computer, a mobile computer, an image reproduction apparatus including a recording medium, a goggle type display, a video camera, and a mobile phone.

22. A light emitting device according to claim 17, wherein the conductive film comprises Al.

23. A light emitting device according to claim 17, wherein the first, second and third cathodes comprise an Al:Li alloy.

24. A light emitting device according to claim 17, wherein each of the first, second, and third anodes is electrically connected to a TFT.

* * * * *